(12) United States Patent
Lin et al.

(10) Patent No.: US 6,784,005 B2
(45) Date of Patent: Aug. 31, 2004

(54) PHOTORESIST REFLOW FOR ENHANCED PROCESS WINDOW FOR RANDOM, ISOLATED, SEMI-DENSE, AND OTHER NON-DENSE CONTACTS

(75) Inventors: Huan-Tai Lin, Hsin Chu (TW); Shinn-Sheng Yu, Taichung (TW); Anthony Yen, Hsin Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/078,064

(22) Filed: Feb. 16, 2002

(65) Prior Publication Data

US 2003/0157808 A1 Aug. 21, 2003

(51) Int. Cl.[7] .......................... H01L 21/66; G01R 31/26
(52) U.S. Cl. .......................... 438/16; 438/947; 438/975
(58) Field of Search .......................... 438/16, 947, 975

(56) References Cited

U.S. PATENT DOCUMENTS

2002/0055252 A1 * 5/2002 Chang ........................ 438/637
2002/0088608 A1 * 7/2002 Park ........................ 165/80.3

* cited by examiner

Primary Examiner—W. David Coleman
(74) Attorney, Agent, or Firm—Tung & Associates

(57) ABSTRACT

Photoresist reflow for an enhanced process window for non-dense contacts is disclosed. A corrective bias is determined for application to each of a number of contacts at different pitches, to achieve a substantially identical critical dimension for each contact. The corrective bias is determined based on a first and a second critical dimension for each contact, where the first critical dimension is before photoresist reflow, and potentially inclusive of optical proximity effects, and the second critical dimension is after photoresist reflow. A photomask is then constructed for a semiconductor design that incorporates the corrective bias that has been determined for the contacts of the design. Lithographical processing of the semiconductor design on a semiconductor wafer using thus photomask, and subsequent photoresist reflow, thus achieves a substantially identical critical dimension for each of the contacts of the semiconductor design.

20 Claims, 7 Drawing Sheets

PHOTORESIST REFLOW FOR ENHANCED PROCESS WINDOW FOR RANDOM, ISOLATED, SEMI-DENSE, AND OTHER NON-DENSE CONTACTS

FIELD OF THE INVENTION

This invention relates generally to semiconductor device fabrication, and more particularly to the use of photoresist reflow in conjunction with assist features and/or off-axis illumination (OAI) for such fabrication.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on lithographic processes. Resolution of anything smaller than a wavelength is generally quite difficult. Pattern fidelity can deteriorate dramatically in sub-wavelength lithography. The resulting semiconductor features may deviate significantly in size and shape from the ideal pattern drawn by the circuit designer. These distortions include line-width variations dependent on pattern density, which affect a device's speed of operation, and line-end shortening, which can break connections to contacts. To avoid these and other optical proximity effects, the semiconductor industry has attempted to compensate for them in the photomasks themselves, as well as by using other approaches.

This compensation in the masks themselves is generally referred to as optical proximity correction (OPC). The goal of OPC is to produce smaller features in an IC using a given equipment set by enhancing the printability of a wafer pattern. OPC applies systematic changes to mask geometries to compensate for the nonlinear distortions caused by optical diffraction and resist process effects. A mask incorporating OPC is thus a system that negates undesirable distortion effects during pattern transfer. OPC works by making small changes to the IC layout that anticipate the distortions. OPC offers basic corrections and a useful amount of device yield improvement, and enables significant savings by extending the lifetime of existing lithography equipment. Distortions that can be corrected by OPC include line-end shortening, corner rounding, and isolated-dense proximity effect.

Isolated-dense proximity effect, or bias, in particular refers to the degree to which the mean of measured dense features differs from the mean of like-sized measured isolated features. Isolated-dense bias is especially important in the context of critical dimensions (CD's), which are the geometries and spacings used to monitor the pattern size and ensure that it is within the customer's specification. CD bias, therefore, refers to when the designed and actual values do not match. Ideally, bias approaches zero, but in actuality can measurably affect the resulting semiconductor device's performance and operation. Isolated features, such as lines and contacts, can also negatively affect depth of focus (DOF), such that they cannot be focused as well with the lithography equipment as can dense features.

Contacts are two-dimensional features that are typically, but not necessarily, substantially square semiconductor features. They generally allow external electrical connectivity to semiconductor devices. Whereas OPC can improve resolution and depth of focus (DOF) for dense arrays and groupings of contacts, it is not as successful for random, isolated, and semi-dense contacts, which are generally referred to herein as non-dense contacts. Random contacts are those that appear randomly isolated within a semiconductor design. Isolated contacts can more generally appear either randomly or on an orderly or regular basis within a design. Semi-dense contacts are those that appear with a periodicity less than a given threshold.

OPC can be used to correct the isolated-dense proximity effect and the isolated-feature DOF reduction by adding scattering bars (SB's) and anti-scattering bars (ASB's) near the edges of opaque and clear features, respectively, on a photomask. SB's are sub-resolution opaque-like features, whereas ASB's are sub-resolution clear-like features. SB's and ASB's are specific examples of assist features, which are features added to the mask that are not specifically part of the intended semiconductor design, but which assist the proper imprinting of the design on the photoresist. Both SB's and ASB's serve to alter the images of isolated and semi-isolated lines to match those of densely nested lines, and improve DOF so that isolated lines can be focused as well as dense lines can with the lithography equipment. For example, FIG. 1A shows a set of SB's 100, whereas FIG. 1B shows the placement of such sets of SB's 100 near an isolated line 102, in contradistinction to the dense sets of lines 104 and 106.

Another issue that impacts the quality of lithography is focus variation, which is nearly ubiquitous in IC manufacturing because of the combined effects of many problems, such as wafer non-flatness, auto-focus errors, leveling errors, lens heating, and so on. A useful lithographic process should be able to print acceptable patterns in the presence of focus variation. Similarly, a useful lithographic process should be able to print acceptable patterns in the presence of variation in the exposure dose, or energy, of the light source being used. To account for these simultaneous variations of exposure dose and /focus, it is useful to map out the process window, such as an exposure-defocus (ED) window, within which acceptable lithographic quality occurs. The process window for a given feature, with or without OPC to compensate for distortions, shows the ranges of exposure dose and DOF that permit acceptable lithographic quality.

For example, FIG. 2 shows a graph 200 of a typical ED process window for a given semiconductor pattern feature. The y-axis 202 indicates exposure dose of the light source being used, whereas the x-axis 204 indicates DOF. The line 206 maps exposure dose versus DOF at one end of the tolerance range for the CD of the pattern feature, whereas the line 208 maps exposure dose versus DOF at the other end of the tolerance range for the CD of the feature. The area 210 enclosed by the lines 206 and 208 is the ED process window for the pattern feature, indicating the ranges of both DOF and exposure dose that permit acceptable lithographic quality of the feature. Any DOF-exposure dose pair that maps within the area 210 permits acceptable lithographic quality of the pattern feature. As indicated by the area 210, the process window is typically indicated as a rectangle, but this is not always the case, nor is it necessary.

Unfortunately, the process window typically varies by pattern feature. For example, the shape of the ED window for dense patterns, such as dense groupings of lines and contacts, is different than that for isolated patterns, such as isolated single lines and contacts. This is usually true even if the patterns have been modified by OPC to compensate for distortions. Individually optimizing the CD's of a wafer's features via OPC thus does not result in a maximized common process window over all the features. For various patterns, each having a different pitch—which is generally defined as the periodicity of a common feature within the pattern, such as a line or a contact—this means that applying OPC to each pattern to achieve identical pattern CD's results in unequal process windows. The unequal process windows cannot be matched to one another to create a maximized common window.

At best, a non-maximized common process window still provides leeway as to varying exposure dose and DOF for obtaining an acceptable lithographic image. At worst, and perhaps more often, the non-maximized common window is more constraining, such that only within a narrow range of exposure dose and DOF will an acceptable lithographic image result. Fabricating semiconductor devices under such constraints is more difficult, and can result in significant wafer scrap and/or reduced fabrication yield and performance. Since most sub-wavelength lithography involves patterns having varying pitch, this can be a serious issue to modern semiconductor device fabrication.

Besides OPC, another approach that can be used to improve patterning is off-axis illumination (OAI). OAI is the shifting of the direction of the exposure beam during lithography from perpendicular, which interrupts the interference pattern that causes standing waves in the underlying photoresist being patterned. OAI particularly has the ability to significantly improve both the resolution and DOF for a given optical lithographic technology. For dense features, especially those having line-to-space duty ratios on the order of 1:1 to 1:3, such improvements are straightforward. Performance improvements are realized when illumination is obliquely incident on a mask at an angle so that the zeroth and first diffraction orders are distributed on alternative sides of the optical axis.

Examples of OAI are shown in FIGS. 3A and 3B. In FIG. 3A, the original center of illumination 302 has an illumination mask 304 positioned thereover. When an off-axis light source is instead used for illumination through the mask 304, first diffraction orders 306a and 306b result. The OAI of FIG. 3A is referred to as conventional OAI because the illumination mask 304 has a standard disc shape. In FIG. 3B, the original center 302 has an illumination mask 310 positioned thereover, resulting in diffraction orders 312a and 312b. The OAI of FIG. 3B is referred to as annular OAI because the illumination mask 310 has a ring shape. Other types of OAI include dipole, quadrupole, and quasar, which vary from one another and from conventional and annular OAI based on the illumination mask shapes used in such types of OAI.

Unfortunately, OAI does not measurably improve the process window, resolution, or DOF for isolated features, and specifically for isolated features that are contacts. This is because discrete diffraction orders do not exist for isolated features; rather, a continuous diffraction pattern is produced. The frequency separation of the diffraction orders is not great enough to improve performance of photolithography for isolated features by using OAI. Therefore, there is a need for improving the process window for non-dense contacts, so that the process window is comparable to that for dense contacts. Such process window improvement should also improve the resolution of these types of contacts, as well as the DOF for them. For these and other reasons, there is a need for the present invention.

SUMMARY OF THE INVENTION

The invention relates to photoresist reflow for an enhanced process window for non-dense contacts. A corrective bias is determined for application to each of a number of contacts at different pitches, to achieve a substantially identical critical dimension for each contact. The corrective bias is determined based on a first and a second critical dimension for each contact, where the first critical dimension is before photoresist reflow, and potentially inclusive of optical proximity effects, and the second critical dimension is after photoresist reflow. A photomask is then constructed for a semiconductor design that incorporates the corrective bias that has been determined for the contacts of the design. Lithographical processing of the semiconductor design on a semiconductor wafer using thus photomask, and subsequent photoresist reflow, thus achieves a substantially identical critical dimension for each of the contacts of the semiconductor design.

The invention provides for advantages not found within the prior art. Semiconductor devices fabricated using the invention have features with substantially the same critical dimensions, regardless of whether the features have different pitches, and thus regardless of whether the features are dense or non-dense. In other words, an overlapping process window is achieved for dense and non-dense features, such as contacts. This can enhance the resolution and the depth of focus (DOF) of the features. Other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1A:
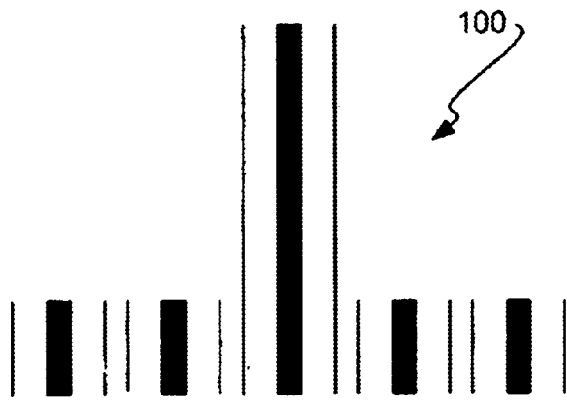
FIGS. 1A and 1B are diagrams showing a scattering bar (SB) and its placement near an isolated line, to compensate for isolated-dense proximity effect.
Figure 1B:
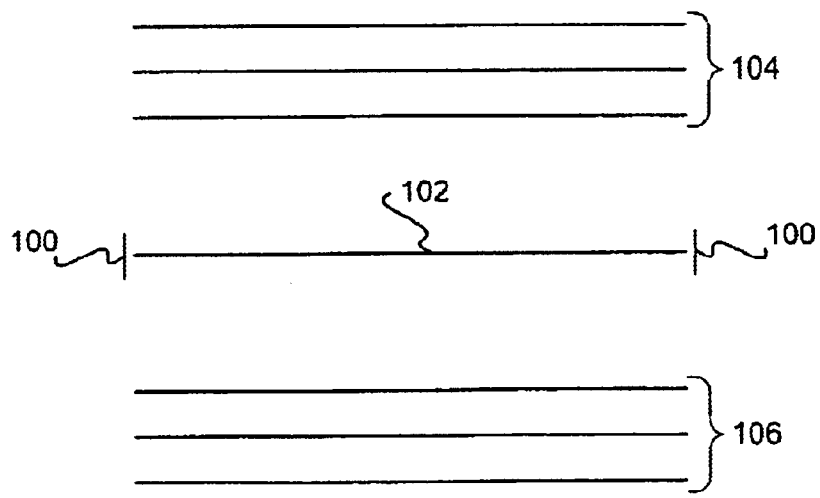
Figure 2:
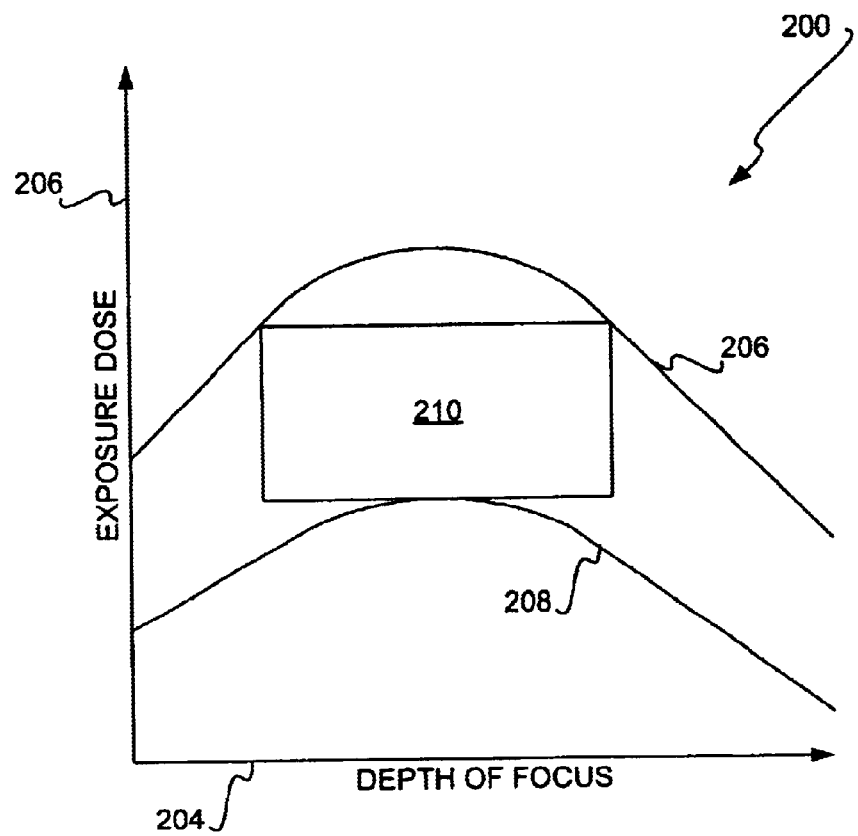
FIG. 2 is a diagram showing an example exposure-defocus (ED) process window for a given pattern feature showing the ranges of exposure dose and focus that permit acceptable lithographic quality.
Figure 3A:
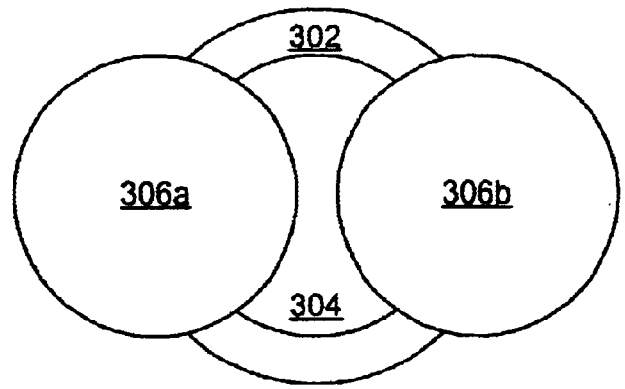
FIGS. 3A and 3B are diagrams showing the diffraction orders that result from different types of off-axis illumination (OAI).
Figure 3B:
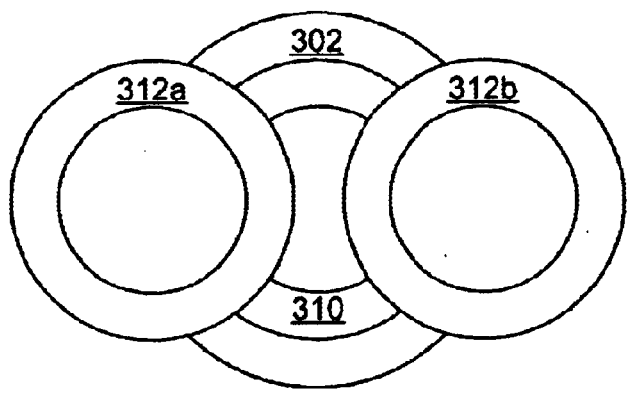
Figure 4:
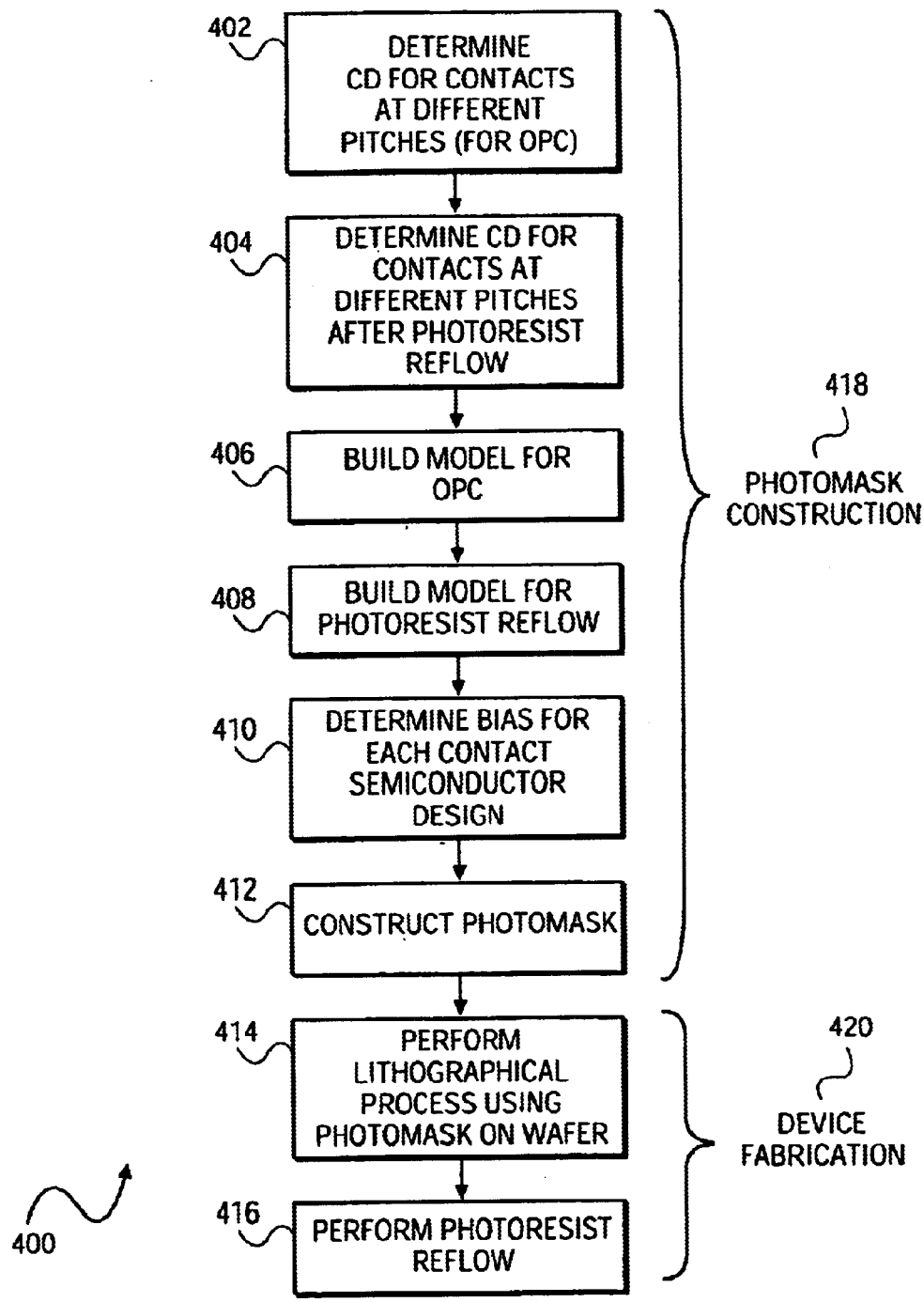
FIG. 4 is a flowchart of a method to create a photomask and to fabricate semiconductor devices, according to an embodiment of the invention.

FIG. 4 shows a method 400 according to an embodiment of the invention. Parts of the method 400 can be used to construct a photomask, and/or to fabricate semiconductor devices on a semiconductor wafer using such a constructed photomask. First, the after-development inspection (ADI) critical dimensions for contacts at different pitches are determined (402). This can be accomplished by exposing a semiconductor wafer using a photomask having contact test patterns of different pitches. The greater the pitch, the denser the contacts are, whereas the lesser the pitch, the less dense the contacts are.

Figure 5:
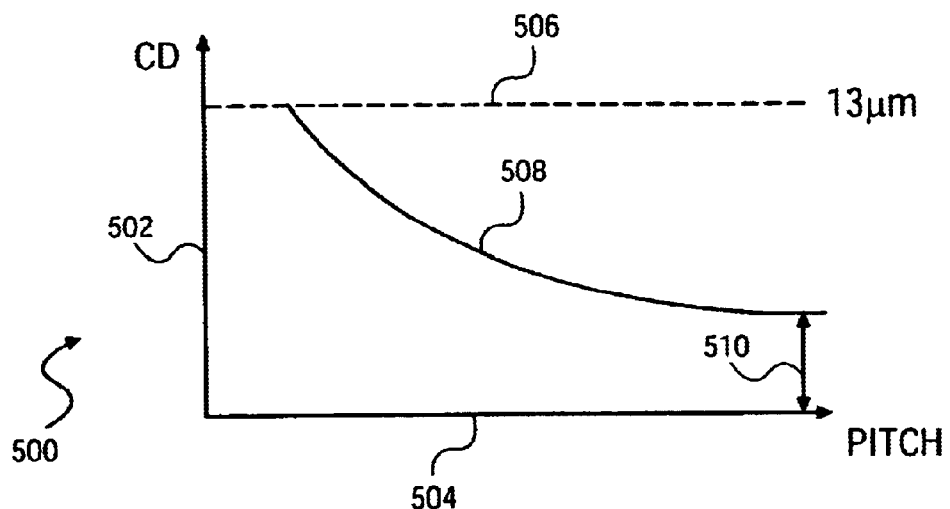
FIG. 5 is a graph showing the critical dimensions of contacts of different pitches, demonstrating the optical proximity effects (OPE) that can occur.

FIG. 5 shows a graph 500 illustrating example results of 402, and that has a y-axis 502 measuring critical dimension (CD), and an x-axis 504 measuring pitch. The dotted line 506 references a critical dimension of 0.13 micron. The line 508 shows the critical dimensions for contacts at various pitches, where the critical dimensions decrease as contact pitch, or density, increases. The line 508 thus demonstrates optical proximity effects (OPE) that occur, and how OPE primarily affects non-dense contacts. Non-dense contact critical dimensions at low density are around 0.13 micron, whereas dense contact critical dimensions are lower, as indicated by the line 510.

Referring back to FIG. 4, the ADI critical dimensions for contacts at different pitches after photoresist reflow is accomplished are determined (404). This can also be accomplished by exposing a wafer using a photomask having contact test patterns of different pitches, and subsequently performing photoresist reflow. Photoresist reflow is the process of heating the photoresist after the photoresist has been patterned, but before the semiconductor wafer has been etched according to this pattern, causing the photoresist to become at least semi-liquid and flow somewhat. It has been determined that photoresist reflow can be used to decrease the critical dimensions of non-dense contacts. The temperature to which the photoresist can be heated during photoresist reflow can be 160 degrees Celsius, or another temperature.

Figure 6:
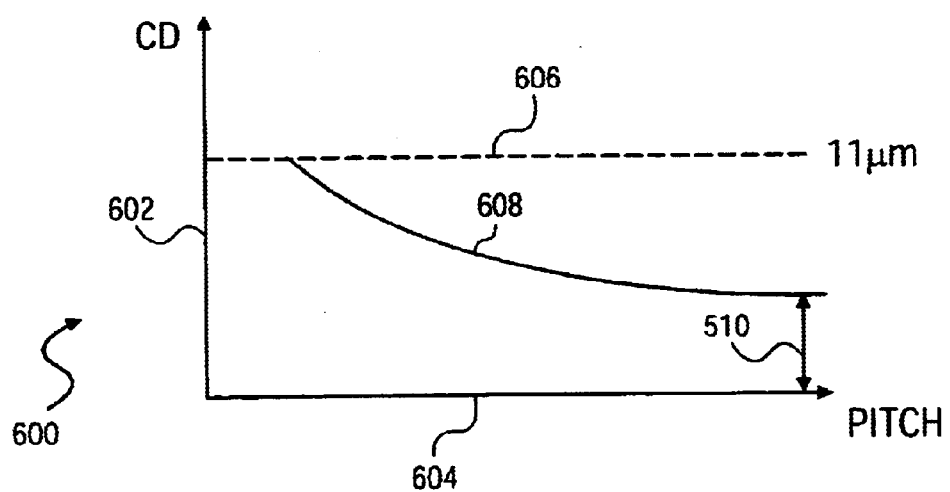
FIG. 6 is a graph showing the critical dimensions of contacts of different pitches, demonstrating the effects of photoresist reflow.

FIG. 6 shows a graph 600 illustrating example results of 404, and that has a y-axis 602 measuring CD, and an x-axis 604 measuring pitch. The dotted line 506 references a critical dimension of 0.11 micron. The line 608 shows the critical dimensions for contacts at various pitches, after photoresist reflow has been accomplished. The line 608 thus demonstrates that photoresist reflow primarily affects non-dense contact critical dimensions, such that these critical dimensions are around 0.11 micron. Conversely, even after photoresist reflow, dense contact critical dimensions are still indicated by the line 510, which is the same height as the line 510 of FIG. 5.

Referring back to FIG. 4, a model for optical proximity correction (OPC) is constructed (406), based on the contact critical dimensions determined in 402. This model attempts to correct for biasing that occurs as a result of OPE, by employing OPC techniques. However, as has been indicated, OPC is more effective for dense contacts than for non-dense contacts. Therefore, another model for photoresist reflow is constructed (408), based on the contact critical dimensions determined in 404. This model leverages the improvement, or reduction, in contact critical dimensions for non-dense contacts. Desirably and preferably, the combination of the model constructed in 406 and the model constructed in 408, when taken together and used to correctively bias the contacts of a semiconductor design, result in the contacts having substantially identical critical dimensions. Based on the models constructed in 406 and 408, the corrective bias that should be applied to each contact of a desired semiconductor design is determined (410).

A photomask is then constructed for the semiconductor design, incorporating the corrective biases that have been determined for each contact of the design (412). The photomask preferably includes OPC assist features based on the model constructed in 406, but allowing for the subsequent photoresist reflow that will be performed that will further bias the contacts as per the model constructed in 408, 402, 404, 406, 408, 410, and 412 can be conceptualized as the photomask construction aspects of the method 400, as indicated by the reference number 418. Semiconductor device fabrication, as indicated by the reference number 420, is then accomplished at least in part by performing a lithographical process using the constructed photomask on a semiconductor wafer (414), and performing photoresist reflow (416).

Figure 7:
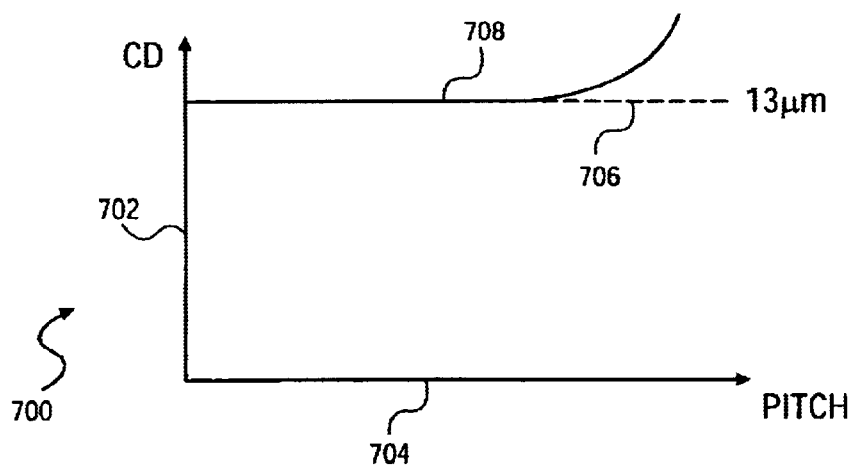
FIG. 7 is a graph showing the critical dimensions of contacts of different pitches, using a photomask according to an embodiment of the invention in which corrective bias has been applied to the contacts, but before photoresist reflow has been accomplished.

FIG. 7 shows a graph 700 illustrating example results of 414, and that has a y-axis 702 measuring CD, and an x-axis 704 measuring pitch. The dotted line 706 references a critical dimension of 0.13 micron. The line 708 shows that after photolithographic processing has been accomplished using the photomask constructed in 412, the contact critical dimensions are substantially at 0.13 micron for less dense contacts, and increase therefrom for more dense contacts. The line 708 thus takes into account the bias for each contact of the semiconductor design that was determined in 410, where this bias takes into account photoresist reflow, even though the line 708 does not reflect the photoresist reflow itself. This is because photoresist reflow has not yet been performed.

Figure 8:
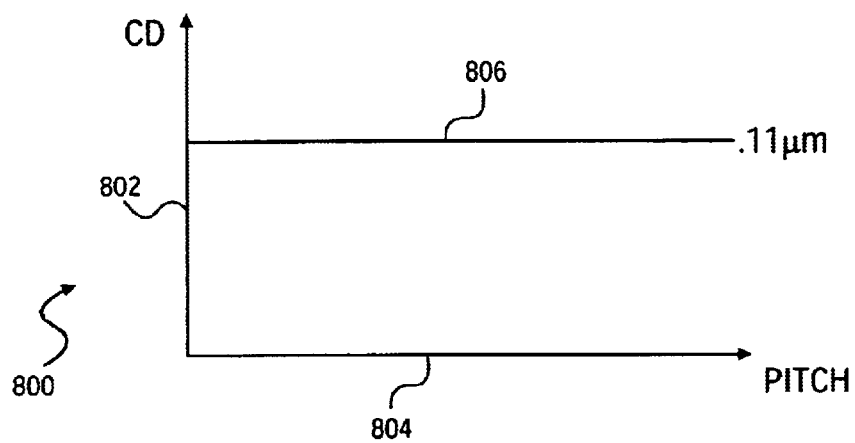
FIG. 8 is a graph showing the critical dimensions of contacts of different pitches, using a photomask according to an embodiment of the invention in which corrective bias has been applied to the contacts, and after photoresist reflow has been accomplished.

By comparison, FIG. 8 shows a graph 800 illustrating example results of 416, and that has a y-axis 802 measuring CD, and an x-axis 804 measuring pitch. The line 806 shows that after photoresist reflow has been performed, the contact critical dimensions are substantially at 0.13 micron for all contacts, regardless of pitch. The line 806 can be conceptualized as the line 708 of FIG. 7 combined with the line 608 of FIG. 6, where the photoresist reflow effect reflected by the line 608 has been integrated into the line 708. The increasing critical dimensions for more dense contacts of the line 708 have been corrected.

Figure 9:
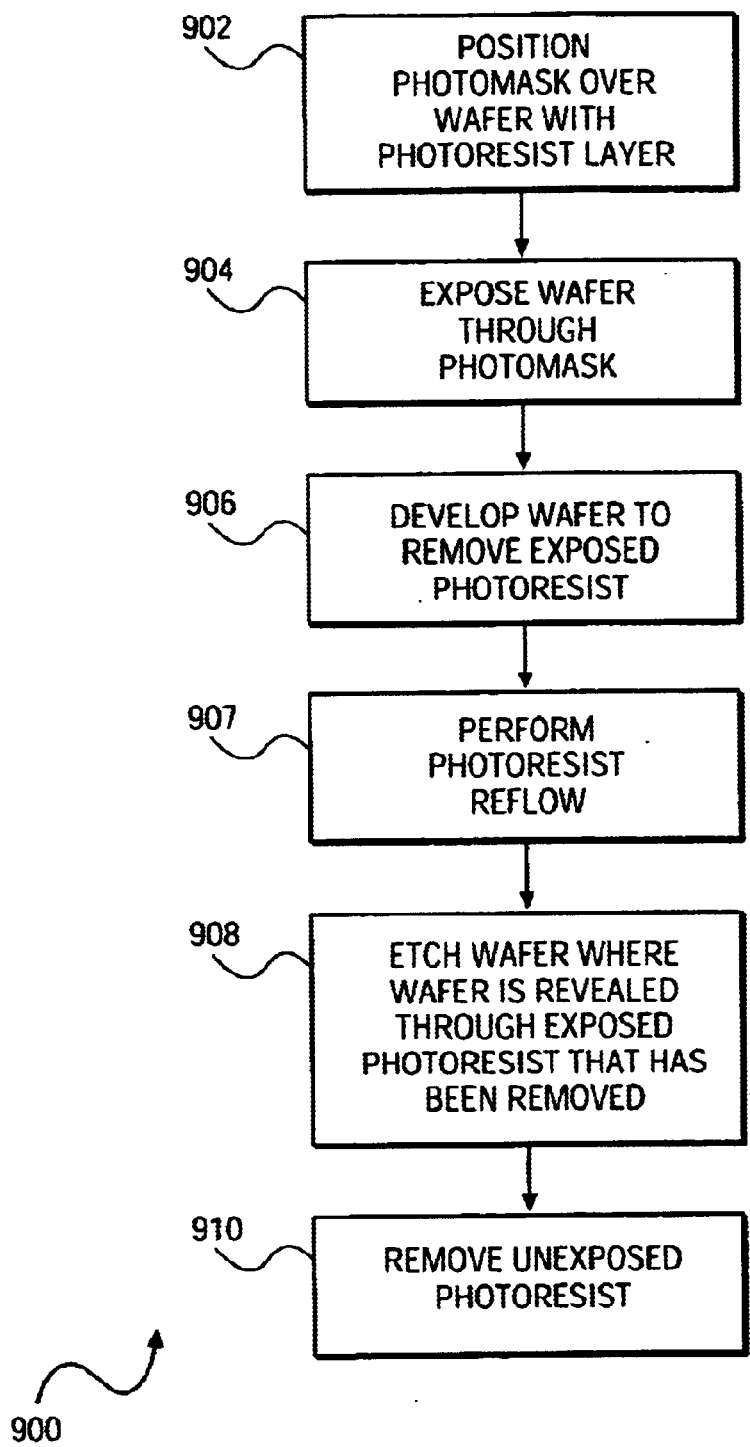
FIG. 9 is a flowchart of a typical method to create one or more semiconductor devices on a wafer using a photolithographic process, and preferably employing a photomask according to an embodiment of the invention.

FIG. 9 outlines a typical method 900 for fabricating semiconductor devices on a semiconductor wafer, and in conjunction with which a photomask according to the invention may be utilized. Other steps and acts may be performed in addition to or in lieu of those shown in FIG. 9, as can be appreciated by those of ordinary skill within the art. The mask is first positioned over the wafer, where the wafer has a top layer of photoresist (902). The wafer is exposed through the mask (904), such that the photoresist has unexposed and exposed regions. The exposed regions correspond to the photoresist that is beneath clear regions of the mask, and the unexposed regions correspond to the photoresist that is beneath opaque regions. The wafer is developed to remove the exposed photoresist (906), and photoresist reflow is performed (907). Finally, etching occurs where the wafer has been revealed through the exposed photoresist that has been removed (908). The unexposed photoresist is then also removed (910).

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. For instance, whereas the invention has been substantially described in relation to semiconductor features that are two-dimensional contacts, it may be applicable to other semiconductor features as well, such as one-dimensional lines and other features. Therefore, it is manifestly intended that this invention be limited only by the claims and equivalents thereof.

What is claimed is:

1. A method comprising:
   determining a corrective bias to be applied to each of a plurality of contacts at different pitches for achieving a substantially identical critical dimension for each of the plurality of contacts at the different pitches, based on a first critical dimension for each of the plurality of contacts at the different pitches before photoresist reflow and a second critical dimension for each of the plurality of contacts at the different pitches after photoresist reflow; and,
   constructing a photomask for a semiconductor design, incorporating the corrective bias determined for contacts of the semiconductor design, such that lithographical processing of the semiconductor design on a semiconductor wafer using the photomask and subsequent photoresist reflow on the semiconductor wafer achieves a substantially identical critical dimension for each of the contacts of semiconductor design.

2. The method of claim 1, further initially comprising determining the first critical dimension for each of the plurality of contacts at the different pitches.

3. The method of claim 2, further comprising constructing a model for optical proximity correction (OPC) of each of the plurality of contacts at the different pitches.

4. The method of claim 1, further initially comprising determining the second critical dimension for each of the plurality of contacts at the different pitches after photoresist reflow.

5. The method of claim 4, further comprising constructing a model for photoresist reflow of each of the plurality of contacts at the different pitches.

6. The method of claim 1, further comprising lithographically processing the semiconductor design on a semiconductor wafer.

7. The method of claim 6, further comprising performing photoresist reflow on the semiconductor design.

8. The method of claim 1, wherein at least some of the plurality of contacts at the different pitches comprise non-dense contacts.

9. The method of claim 8, wherein the non-dense contacts comprise one or more isolated contacts.

10. The method of claim 8, wherein the non-dense contacts comprise one or more random contacts.

11. The method of claim 8, wherein the non-dense contacts comprise one or more semi-dense contacts.

12. A photomask formed at least in part by performing a method comprising:
    determining a first critical dimension for each of a plurality of contacts at different pitches;
    determining a second critical dimension for each of the plurality of contacts at the different pitches after photoresist reflow;
    determining a corrective bias to be applied to each of the plurality of contacts at the different pitches for achieving a substantially identical critical dimension for each of the plurality of contacts at the different pitches, based on the first critical dimension and the second critical dimension for each of the plurality of contacts at the different pitches; and,
    constructing a photomask for a semiconductor design, incorporating the corrective bias determined for contacts of the semiconductor design, such that lithographical processing of the semiconductor design on a semiconductor wafer using the photomask and subsequent photoresist reflow on the semiconductor wafer achieves a substantially identical critical dimension for each of the contacts of semiconductor design.

13. The photomask of claim 12, further comprising, prior to determining the corrective bias to be applied to each of the plurality of contacts at the different pitches, constructing a model for optical proximity correction (OPC) of each of the plurality of contacts at the different pitches.

14. The photomask of claim 12, further comprising, prior to determining the corrective bias to be applied to each of the plurality of contacts at the different pitches, constructing a model for photoresist reflow of each of the plurality of contacts at the different pitches.

15. The photomask of claim 12, wherein at least some of the plurality of contacts at the different pitches comprise non-dense contacts.

16. The photomask of claim 15, wherein the non-dense contacts comprise one or more isolated contacts.

17. The photomask of claim 15, wherein the non-dense contacts comprise one or more random contacts.

18. The photomask of claim 15, wherein the non-dense contacts comprise one or more semi-dense contacts.

19. A semiconductor device formed at least in part by a method comprising:
    positioning a photomask over a semiconductor wafer having a top layer of photoresist, the photomask constructed by incorporating a corrective bias for contacts of a semiconductor design determined for each of a plurality of contacts at different pitches to achieve a substantially identical critical dimension for each of the plurality of contacts at the different pitches, based on a first critical dimension before photoresist reflow and a second critical dimension after photoresist reflow for each of the plurality of contacts at the different pitches;
    exposing the semiconductor wafer through the photomask positioned thereover, such that the top layer of photoresist includes exposed parts under clear parts of the photomask and unexposed parts under opaque parts of the photomask;
    developing the semiconductor wafer to remove the exposed parts of the top layer of photoresist;
    performing photoresist reflow of the unexposed parts of the top layer of photoresist;
    etching the semiconductor wafer where the wafer is revealed through the exposed parts of the top layer of photoresist that has been removed; and,
    removing the unexposed parts of the top layer of photoresist.

20. The device of claim 19, wherein at least some of the contacts of the semiconductor design comprise non-dense contacts.

* * * * *